(12) United States Patent
Chen et al.

(10) Patent No.: US 11,969,771 B2
(45) Date of Patent: Apr. 30, 2024

(54) FILM VIBRATION DEVICE AND FABRICATION METHOD THEREOF, AND CLEANING DEVICE INCLUDING THE SAME

(71) Applicant: Guangdong University of Technology, Guangzhou (CN)

(72) Inventors: Yun Chen, Guangzhou (CN); Biao Li, Guangzhou (CN); Aoke Song, Guangzhou (CN); Shankun Dong, Guangzhou (CN); Shengbao Lai, Guangzhou (CN); Maoxiang Hou, Guangzhou (CN); Xin Chen, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 18/359,139

(22) Filed: Jul. 26, 2023

(65) Prior Publication Data
US 2023/0364657 A1    Nov. 16, 2023

(30) Foreign Application Priority Data

Jul. 27, 2022   (CN) .......................... 202210896480.9

(51) Int. Cl.
*B08B 7/02*   (2006.01)
*B06B 1/06*   (2006.01)
*G03F 7/40*   (2006.01)

(52) U.S. Cl.
CPC ............ *B08B 7/028* (2013.01); *B06B 1/0688* (2013.01); *B06B 2201/56* (2013.01); *B06B 2201/71* (2013.01); *G03F 7/405* (2013.01)

(58) Field of Classification Search
CPC ................ G06F 3/041; H01L 21/2313; H01L 21/23133; H01L 21/32134; H01L 27/1214; H01L 27/1259
See application file for complete search history.

(56) References Cited

U.S. PATENT DOCUMENTS

2004/0028875 A1   2/2004  Van Rijn
2006/0100299 A1*  5/2006  Malik ................... G02F 1/1339
                                                      522/31

(Continued)

FOREIGN PATENT DOCUMENTS

CN       103646870 A     3/2014
WO       2019163740 A1   8/2019

*Primary Examiner* — Joel D Crandall

(57) ABSTRACT

A method of fabricating a film vibration device, including: photoetching a surface of a silicon wafer to form a circular-hole array; etching an aluminum layer on the silicon wafer; etching the silicon wafer to form a through-hole array to obtain a porous silicon wafer; attaching a polyethylene terephthalate (PET) sheet to a side of the porous silicon wafer; ablating the PET sheet to obtain a porous PET film; attaching a polyvinylidene fluoride (PVDF) film to a lower side of the porous silicon wafer; performing vacuumization above the porous silicon wafer, while heating the PVDF film below the porous silicon wafer to create dome microstructures on the PVDF film; and laminating the porous PET film on each of two sides of the PVDF film to obtain the film vibration device. This application also provides a cleaning device having the film vibration device.

9 Claims, 7 Drawing Sheets

(56) References Cited

U.S. PATENT DOCUMENTS

| | | | |
|---|---|---|---|
| 2008/0001280 A1* | 1/2008 | Kusumoto | H01L 23/5389 29/601 |
| 2008/0070393 A1* | 3/2008 | Miyairi | B23K 26/0884 257/E21.414 |
| 2008/0193717 A1* | 8/2008 | Jongerden | B32B 15/04 427/164 |
| 2010/0051918 A1* | 3/2010 | Saito | H05B 33/14 257/40 |
| 2010/0283041 A1* | 11/2010 | Nakamura | H10K 50/30 257/E51.025 |
| 2011/0220883 A1* | 9/2011 | Nakano | C07C 43/2055 564/426 |
| 2019/0198786 A1* | 6/2019 | Shimizu | G06K 19/07724 |
| 2020/0203292 A1* | 6/2020 | Kawai | H10K 10/484 |
| 2020/0381703 A1* | 12/2020 | Browne | H01M 4/0471 |

* cited by examiner

FILM VIBRATION DEVICE AND FABRICATION METHOD THEREOF, AND CLEANING DEVICE INCLUDING THE SAME

CROSS-REFERENCE TO RELATED APPLICATIONS

This application claims the benefit of priority from Chinese Patent Application No. 202210896480.9, filed on Jul. 27, 2022. The content of the aforementioned application, including any intervening amendments thereto, is incorporated herein by reference in its entirety.

TECHNICAL FIELD

This application relates to precision part cleaning devices, and more particularly to a film vibration device and a fabrication method thereof, and a cleaning device including the same.

BACKGROUND

Product quality is closely associated with the market competitiveness and survival of enterprises. Product quality control is systematic engineering involving many links, among which the product cleanliness is an important index because it is related to product performance, quality, service life, and reliability. Especially, high-tech products, with characteristics of high performance, high reliability, high precision, high integration, and miniaturization, have extremely requirements for cleanliness, and the product performance and quality will be seriously affected even in the presence of tiny pollutants.

Many precision parts in the industry are to contamination due to complex machining process and various geometric shapes. Moreover, the contaminant generally has complex composition. The presence of contaminants will seriously affect the performance and life of the precision parts, and thus a reliable cleaning technology is necessary to ensure that the surface of the precision parts reaches an extremely high degree of cleanliness. In view of this, the cleaning technology plays an extremely important role in ensuring the electrical and mechanical properties of the product.

At present, the precision parts are cleaned mainly by a mechanical method and a chemical method. The mechanical method is performed by ultrasonic cleaning or scrubbing in a cleaning agent. However, the ultrasonic cleaning will produce great noise pollution, and the scrubbing will result in bristle residues. The chemical method adopts various chemical reagents, such as hot nitric acid, aqua regia, concentrated hydrofluoric acid, and hot acid mixture (i.e., concentrated sulfuric acid-chromic acid, and concentrated sulfuric acid-hydrogen peroxide), which will cause environmental pollution or introduce other impurities. Moreover, the chemical method is high-cost and complex, and therefore cannot meet the cleaning requirements of the precision parts.

SUMMARY

A first object of the present disclosure is to provide a film vibration device and a fabrication method thereof to solve the problem that the existing cleaning technologies cannot meet the cleaning requirements of the precision parts.

A second object of the present disclosure is to provide a cleaning device to solve the problems of large power consumption, high cost and serious noise pollution of the existing ultrasonic cleaning devices.

The technical solutions of the present disclosure are described below.

In a first aspect, this application provides a method of preparing a film vibration device, comprising:

(S1) forming a circular-hole array on a surface of a silicon wafer by photoetching;

(S2) etching an aluminum layer on the silicon wafer;

(S3) etching the silicon wafer to form a through-hole array, so as to obtain a porous silicon wafer;

(S4) attaching a polyethylene terephthalate (PET) sheet to a side of the porous silicon wafer; and subjecting the PET sheet to breakdown with the porous silicon wafer as a mask to obtain a porous PET film;

(S5) attaching a polyvinylidene fluoride (PVDF) film to a lower side of the porous silicon wafer; performing vacuumization above the porous silicon wafer, and simultaneously heating the PVDF film below the porous silicon wafer such that a plurality of dome micro-structures are formed on the PVDF film; and (S6) laminating the porous PET film on each of two sides of the PVDF film having the plurality of dome microstructures to obtain the film vibration device.

In some embodiments, step (S1) comprises:

(S1-1) depositing an aluminum film on the silicon wafer to form the aluminum layer on the surface of the silicon wafer;

(S1-2) applying a photoresist to a top of the aluminum film followed by soft baking to form a photoresist layer on the surface of the aluminum layer; and (S1-3) subjecting the photoresist layer to patterning through photoetching followed by exposure and development with a developer.

In some embodiments, step (S2) comprises:

(S2-1) drying the silicon wafer after photoetched; and (S2-2) immersing the silicon wafer in an aluminum etchant to etch an exposed part of the aluminum layer.

In some embodiments, step (S3) comprises:

(S3-1) etching the silicon wafer through a plasma reaction;

(S3-2) removing a photoresist layer; and (S3-3) etching a remaining part of the aluminum layer with an aluminum etchant to obtain the porous silicon wafer.

In some embodiments, step (S4) comprises:

(S4-1) attaching the PET sheet to the side of the porous silicon wafer, wherein the PET sheet has a thickness of 45-55 μm; and (S4-2) ablating the PET sheet by a laser grating with the porous silicon wafer as the mask; and separating an ablated PET sheet from the porous silicon wafer to obtain the porous PET film.

In some embodiments, in step (S5), the heating is performed through three annealing-cooling operations, each comprising:

heating a bottom of the PVDF film at 75-85° C. for 4-6 min; and cooling the PVDF film to room temperature while keeping vacuum above the PVDF film.

In some embodiments, a thickness of the PVDF film is 8-12 μm.

In some embodiments, each of two sides of the PVDF film is coated with a silver electrode layer having a thickness of 60-80 nm.

In a second aspect, this application provides a film vibration device prepared by the aforementioned method, comprising:
- a first porous PET film;
- a second porous PET film; and
- a PVDF film;
- wherein the PVDF film is sandwiched between the first porous PET film and the second porous PET film; the first porous PET film and the second porous PET film have the same structure; the first porous PET film is arranged above the PVDF film; and the second porous PET film is arranged below the PVDF film; and
- the PVDF film is provided with a plurality of dome micro-structures adapted to a through-hole array of the first porous PET film; the plurality of dome microstructures are embedded in the through-hole array of the first porous PET film; and two sides of the PVDF film are each coated with a silver electrode layer.

In a third aspect, this application provides a cleaning device, comprising:
- a container;
- a control panel; and
- the aforementioned film vibration device;
- wherein the film vibration device is arranged on a bottom of the container, and is electrically connected with the control panel.

Compared with the prior art, this application has the following beneficial effects.

Regarding the fabrication method provided herein, as both the dome micro-structures on the PVDF film and the porous PET film are fabricated using the porous silicon wafer as a mold, the holes on the porous PET film are adapted to the dome micro-structures on the PVDF film in size. Therefore, when the edges of the PVDF film are aligned with the edges of the two porous PET films, it can ensure that the dome micro-structures are aligned with the through holes on the porous PET film. The porous PET films and the PVDF film having the dome micro-structures are laminated together by a roll-to-roll lamination method.

The film vibration device has the advantages of simple structure, low cost, low energy consumption and good scalability. The ultrasound-generating performance of the film vibration device is determined by the vibration of the dome micro-structures. When an alternating current voltage is applied to the silver electrode layer, the strain induced by the electric field will lead to the periodic expansion and contraction of the dome micro-structures, thus generating ultrasonic waves with controllable frequency and intensity. When the ultrasonic waves are transmitted to the precision parts, a cavitation reaction will occur on the surface of the precision parts, thereby removing the contaminants from the surface of the precision parts and completing the cleaning process.

The cleaning device has fast cleaning speed, good cleaning effect, less environmental and noise pollution, high adaptability to precision parts with various complex shapes. Moreover, it is easy to realize the remote control and automated operation of the cleaning device. Therefore, the cleaning device can solve the problems of high power consumption, high cost and serious noise pollution in the existing ultrasonic cleaning devices.

Figure 1:
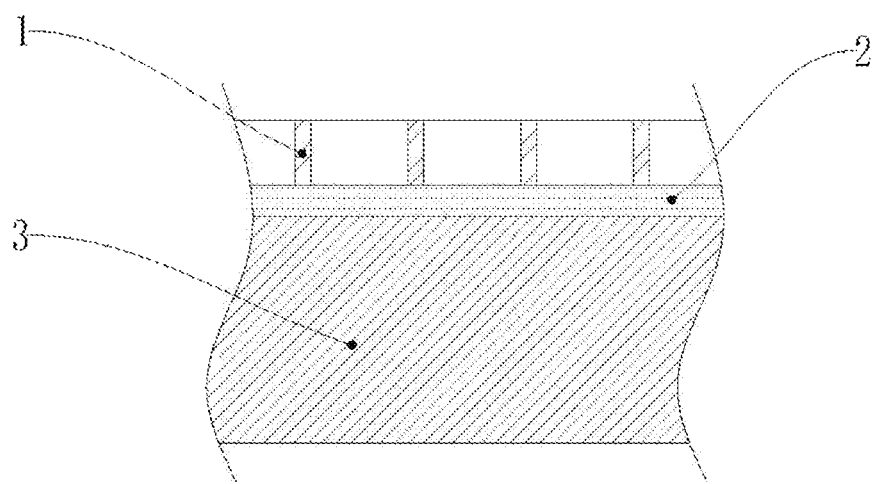
FIG. 1 schematically shows step (S1) in a method of preparing a film vibration device according to an embodiment of the present disclosure.

In the drawings, 1, photoresist layer; 2, aluminum layer; 3, silicon wafer; 31, porous silicon wafer; 4, laser emitter; 5, laser grating; 6, polyethylene terephthalate (PET) sheet; 61, porous PET film; 7, silver electrode layer; 8, polyvinylidene fluoride (PVDF) film; 9, cleaning container; 10, control panel; and 11, film vibration device.

DETAILED DESCRIPTION OF EMBODIMENTS

Embodiments of the present disclosure are described in detail below, and examples of the embodiments are shown in the accompanying drawings, in which the same or similar labels throughout denote the same or similar elements or elements having the same or similar functions. The embodiments described below with reference to the accompanying drawings are exemplary and are merely intended for explaining the present disclosure, and thus are not to be construed as limitations on the present disclosure.

It should be understood that as used herein, all directional indicators (such as up, down, top, and bottom) in the embodiments of this application are used to explain the orientation or positional relationship as shown in the accompanying drawings, and are merely intended to facilitate and simplify the description of the present disclosure, rather than indicating of suggesting that the device or element referred to is constructed and operated in a particular orientation. Therefore, these directional indicators should not be construed as limitations on the present disclosure. In addition, the features defined with "first" and "second" may explicitly or implicitly include one or more such features, which are merely intended to distinguish the descriptive features and do not imply any particular order or importance.

In the description of the present disclosure, unless otherwise indicated, the term "a plurality of" means two or more.

In the description of the present disclosure, it should be noted that, unless otherwise expressly specified and limited, the terms "mounting", "connecting", and "connection" are to be understood in a broad sense. For example, the term "connection" may refer to a fixed connection, a detachable connection, or a connection in one piece; a mechanical connection or an electrical connection; a direct connection or an indirect connection through an intermediate medium; and a connection within two elements. For one of ordinary skill in the art, the specific meaning of the above terms in the description of the present disclosure may be understood in specific cases.

Referring to FIGS. 1-7, a method for preparing a film vibration device is provided, which includes the following steps.

(S1) A circular-hole array is formed on a surface of the silicon wafer 3 by photoetching.

(S2) An aluminum layer 2 on the silicon wafer 3 is subjected to etching.

(S3) The silicon wafer 3 is subjected to etching to form a through-hole array, so as to obtain a porous silicon wafer 31.

(S4) A polyethylene terephthalate (PET) sheet 6 is attached to a side of the porous silicon wafer 31, and is subjected to breakdown with the porous silicon wafer 31 as a mask to obtain a porous PET film 61.

(S5) A polyvinylidene fluoride (PVDF) film 8 is attached to a lower side of the porous silicon wafer 31. Vacuumization is performed above the porous silicon wafer 31, and simultaneously the PVDF film 8 is heated below the porous silicon wafer 31 such that a plurality of dome micro-structures are formed on the PVDF film 8.

(S6) The porous PET film 61 is laminated on each of two sides of the PVDF film 8 with the dome micro-structures to obtain the film vibration device.

Figure 5:
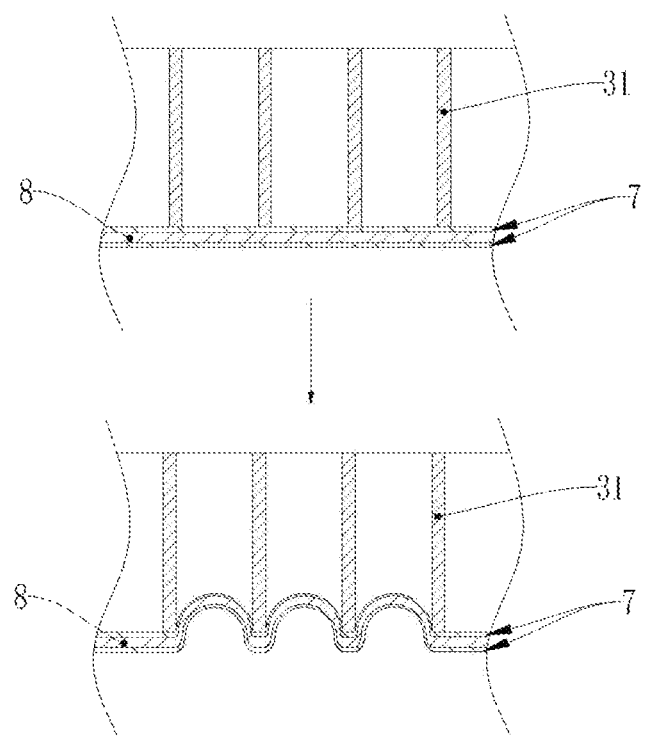
FIG. 5 schematically shows step (S5) in the method according to an embodiment of the present disclosure.

The film vibration device prepared by the aforementioned method includes a PVDF film 8 and two porous PET films 61. The PVDF film 8 is sandwiched between the two porous PET films 61 through lamination. Referring to FIG. 5, by performing step (S5), the PVDF film 8 is recessed toward the through-holes of the porous silicon wafer 31 on one side to form a dome micro-structure array. Such active elements with densely distributed and independent dome micro-structure array generate ultrasonic waves with controllable intensity and frequency by vibration under the excitation of an alternating voltage.

The dome micro-structure array formed by step S5 is in the form of a spherical diaphragm for high-frequency vibration. The shape and size of the through-holes on the porous silicon wafer 31 can be accurately defined according to the micro-machining in steps (S1)-(S4), which improves the sensitivity of the emitted high-frequency ultrasound.

Figure 6:
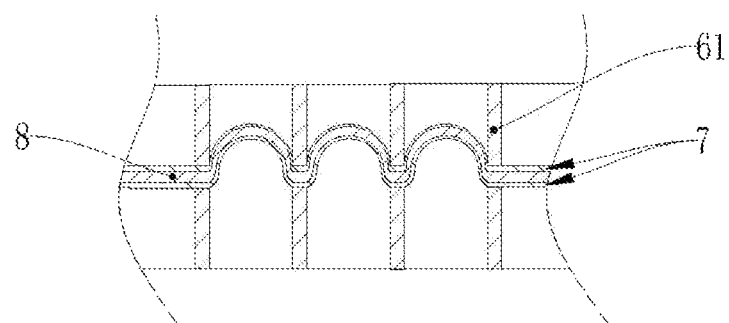
FIG. 6 schematically shows step (S6) in the method according to an embodiment of the present disclosure.

Referring to FIG. 6, the dome micro-structures on the PVDF film 8 are independent from each other and are sandwiched on both sides by the porous PET film 61. As a result, the dome micro-structures do not directly contact the mounting surface. When the film vibration device is bonded to a rigid surface, the dome micro-structures on the PVDF film 8 still can vibrate freely. This ensures that the ultrasonic performance of the film vibration device will be not affected, and a sufficiently high resonance frequency can be achieved. In addition, the shape and size of the dome micro-structures bring additional design freedom, thus allowing the ultrasonic performance to be adjusted over a wide range, thereby achieving good cleaning effects.

Regarding the aforementioned method, as both the dome micro-structure array on the PVDF film 8 and the porous PET film 61 are fabricated using the porous silicon wafer 31 as a mold, the porous PET film 61 is adapted to the size of the dome micro-structure array on the PVDF film 8. Therefore, when the edges of the PVDF film 8 are aligned with the edges of the two porous PET films 61, the holes of the dome micro-structure array and the porous PET film 61 are aligned. The porous PET films 61 and the PVDF film 8 with the dome micro-structure array are laminated together by a roll-to-roll method using a lamination process. In the specific embodiment of the present disclosure, the size of the circular holes is 100-500 μm. Therefore, the diameter of the holes on the porous PET film 61 and the diameter of the dome micro-structure are 100-500 μm.

Referring to FIG. 1, specifically, step (S1) includes the following steps.

(S1-1) An aluminum film is deposited on the silicon wafer 3 to form the aluminum layer 2 on the surface of the silicon wafer 3.

(S1-2) A photoresist is applied to a top of the aluminum film followed by soft baking to form the photoresist layer 1 on the surface of the aluminum layer 2.

(S1-3) The photoresist layer 1 is subjected to patterning through photoetching followed by exposure and development with a developer.

In a specific embodiment, an aluminum film is deposited on the silicon wafer 3 through evaporation to form an aluminum layer 2 on the surface of the silicon wafer 3, i.e., an aluminum mask of the silicon wafer 3. Then AZ4620 photoresist is spin-coated on the surface of the aluminum film followed by soft baking on a heated plate at 105-115° C. for 2-5 min. The photoresist layer 1 is then subject to patterning through photoetching and developed after exposure by AZ435 developer for 4-6 min to form a circular-hole array on the photoresist layer 1. The size of circular holes in the circular-hole array is 100-500 μm, and the size and the spacing between the circular holes are adapted to the dome micro-structures on the PVDF film 8. The photoresist layer 1 is a photoresist mask for the aluminum layer 2.

Figure 2:
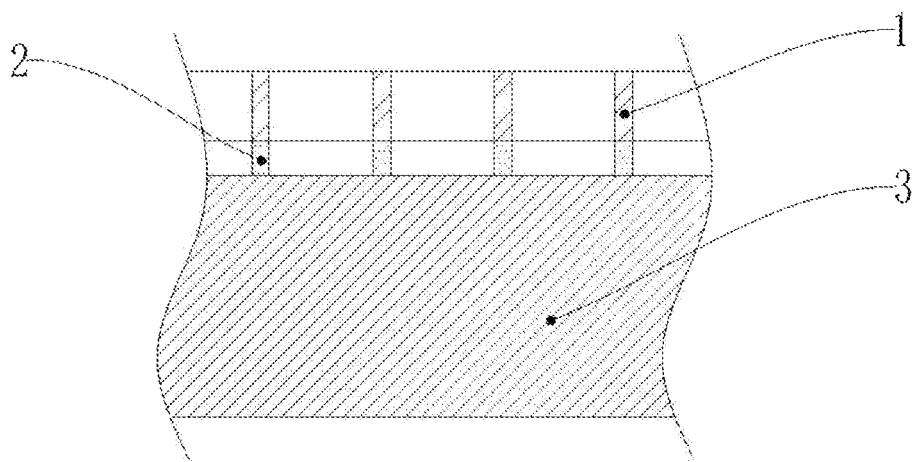
FIG. 2 schematically shows step (S2) in the method according to an embodiment of the present disclosure.

Referring to FIG. 2, specifically, the step (S2) includes the following steps.

(S2-1) The silicon wafer 3 is dried after photoetched.

(S2-2) The photoetched silicon wafer 3 is immersed in an etching agent to etch the aluminum layer 2 exposed to the etching agent.

In a specific embodiment, the photoetched silicon wafer 3 is further baked in an oven at 115-125° C. for 28-32 min, and then is immersed in an aluminum etchant type A. As the photoresist layer 1 having a circular-hole array exists on the surface of the aluminum layer 2, when the photoetched silicon wafer 3 is immersed in the aluminum-etching agent, the circular-hole array in the photoresist layer 1 exposes a part of the aluminum layer 2 to the aluminum-etching agent to be etched such that the aluminum layer 2 surface is left with an aluminum circular-hole array.

Figure 3:
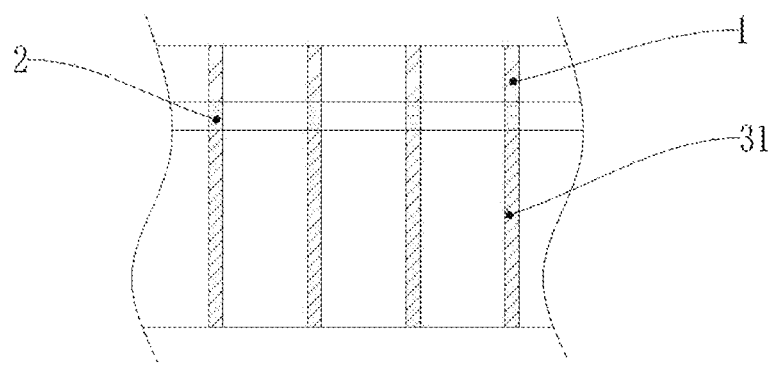
FIG. 3 schematically shows step (S3) in the method according to an embodiment of the present disclosure.

Referring to FIG. 3, specifically, step (S3) includes the following steps.

(S3-1) The silicon wafer 3 is etched through a plasma reaction.

(S3-2) The photoresist layer 1 is removed.

(S3-3) A remaining part of the aluminum layer 2 is etched with an aluminum etchant to obtain the porous silicon wafer 31.

The plasma etching is an existing process. In a specific embodiment, the plasma includes SF6 and C4F8, by which the silicon wafer 3 is etched along the aluminum circular-hole array, such that a through-hole array is formed on the silicon wafer 3. Subsequently, the photoresist layer 1 is removed with acetone, and the remaining aluminum layer 2 is etched with the type A aluminum-etching agent to prevent the residual photoresist layer 1 and aluminum layer 2 from affecting the subsequent operations.

Figure 4:
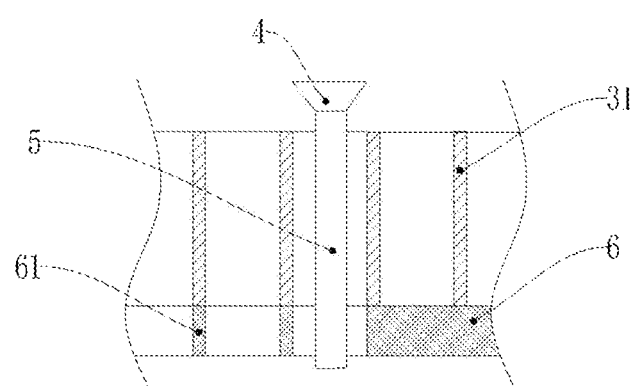
FIG. 4 schematically shows step (S4) in the method according to an embodiment of the present disclosure.

Referring to FIG. 4, specifically, step S4 includes the following steps.

(S4-1) The PET sheet 6 is attached to the side of the porous silicon wafer 31, where the PET sheet 6 has a thickness of 45-55 μm.

(S4-2) The PET film 6 is ablated by a laser grating 5 with the porous silicon wafer 31 as the mask. The ablated PET sheet 6 is separated from the porous silicon wafer 31 to obtain a porous PET film 61.

The laser grating 5 is emitted by a laser transmitter 4, and the structure and working principle of the laser transmitter 4 can be referred to existing laser transmitters. As a simple replacement, the porous PET film 61 can also be fabricated by casting or injection molding. The PET sheet 6 is commercially available, whose thickness can be selected as 45-55 μm.

In the film vibration device, the porous PET film 61 consists of a top PET layer and a bottom PET layer. The top PET layer is configured to protect the convex dome micro-structures on the PVDF film 8 from abrasion and mechanical impacts. In addition, since the holes in the top PET layer are open, the top PET layer does not restrict their vibration. The bottom PET layer is configured to isolate the raised dome micro-structures on the PVDF film 8 to form a spacious back cavity, which facilitates the installation of the film vibration device.

Specifically, in step (S5), the PVDF film 8 is heated through three annealing-cooling operations, each including the following process.

The bottom of the PVDF film 8 is heated at 75-85° C. for 4-6 min and cooled to room temperature while keeping vacuum above the PVDF film 8.

The PVDF film 8 is so thin that the pressure difference generated by the vacuum and the heat source can make it expand, but the PVDF film 8 cannot be forced to pass through the porous PET film 61. Therefore, tiny upwardly-protruding dome micro-structures appear where there is no blockage by the porous PET film 61. The size of the dome micro-structures depends on the diameter of the circular hole at the photoetching process in step S1, and the height of the dome micro-structures depends on the vacuum level. Therefore, the silicon mold can be changed according to the micro-machining and embossing conditions, and the dome size can be adjusted in a wide range. The bottom of the PVDF film 8 is heated at 75-85° C. for 4-6 min, which is sufficient to relieve the stresses and does not affect the polarization of the PVDF film 8.

Further, the PVDF film 8 has a thickness of 8-12 The PVDF film 8 is commercially available.

Further, a silver electrode layer 7 is deposited on each of two sides of said PVDF film 8. The thickness of the silver electrode layer 7 is 60-80 nm. The dome micro-structures on the PVDF film 8 are all electrically connected through the silver electrode layer 7. When an alternating current voltage is applied to the silver electrode layer 7, the electric field-induced strains make the dome micro-structures periodically to expand and contract, generating a sufficiently high resonance frequency to parallelly drive the generation of ultrasound.

In specific applications, these dome micro-structures can be controlled individually or in pieces by controlling the layout pattern of the silver electrode layer 7 or by controlling the thickness of the silver electrode layer 7 in different regions of the same piece of PVDF film 8, rendering the film vibration device emitting ultrasound at different frequencies in different regions, thereby achieving different cleaning effects on different portions of the precision part.

Referring to FIG. 6, the present disclosure also provides a film vibration device, which is fabricated by the above-mentioned preparation method. The film vibration device includes a first porous PET film, a second porous PET film and a PVDF film. The PVDF film is sandwiched between the first porous PET film and the second porous PET film. The first porous PET film and the second porous PET film have the same structure. The first porous PET film is located above the PVDF film, and the second porous PET film is located below the PVDF film.

The PVDF film is provided with a plurality of dome micro-structures in one-to-one correspondence to the through-holes of the first porous PET film, and the plurality of dome micro-structures are embedded in the through-holes. A silver electrode layer is deposited on both sides of the PVDF film.

The first porous PET film and the second porous PET film have the same structure and are both prepared by piercing a PET sheet with a porous silicon wafer 31 as a mask using a laser grating. Since the dome micro-structures on the PVDF film 8 also similarly use the porous silicon wafer 31 as a mask, the sizes and positions of the dome micro-structures are adapted to the through holes of the first porous PET film and the second porous PET film.

The diameter of each of the dome micro-structures on the PVDF film 8 is 100-500 μm, which can be selected according to the actual situation. The distance between the dome micro-structures is only a few tens of micrometers, while the dome micro-structures are independent from each other and do not affect each other. In this case, the density of the dome microstructures on the PVDF film 8 in the film vibration device is large. Moreover, the film vibration device does not vibrate the entire PVDF film 8, but relies on the vibration of the dome micro-structures on the piezoelectric material PVDF film 8 to generate ultrasonic waves, and each of the dome micro-structures vibrates individually.

Each of the dome micro-structures has a diameter of 100-500 μm, and is enclosed by the first porous PET film and the second porous PET film to prevent the dome micro-structures from being affected by the mounting surfaces, allowing for the free vibration of the dome micro-structures. The porous PET film 61 protects the dome from abrasion and impact during daily operation, improving the durability of the film vibration device. Moreover, the film vibration device is prepared from the first porous PET film, the second porous PET film, and the PVDF film, which is a flexible film device, enhancing the adaptability of the film vibration device to the use environment.

The film vibration device generates ultrasonic waves through the periodic contraction and expansion of the dome micro-structure to complete the cleaning. The frequency and intensity of the ultrasonic waves can be adjusted by the alternating frequency and alternating voltage of the alternating voltage. In addition, the film vibration device is thin and lightweight, and the processing technology is simple, which saves economic cost and time cost.

In a preferred embodiment, the film vibration device can individually or in pieces control these micro-structures by controlling the layout pattern of the silver electrode layer 7, thereby generating an ultrasonic phased array. When cleaning the precision parts, the ultrasonic phased array technology can be used to check the morphology of the surface of the precision parts by using the ultrasonic rebound effect, so as to detect whether the surface micro-structures of the precision parts are damaged and find the location of the defects of the displayed parts. In this way, the precision parts can be replaced timely, avoiding the precision instrument from being damaged.

Figure 7:
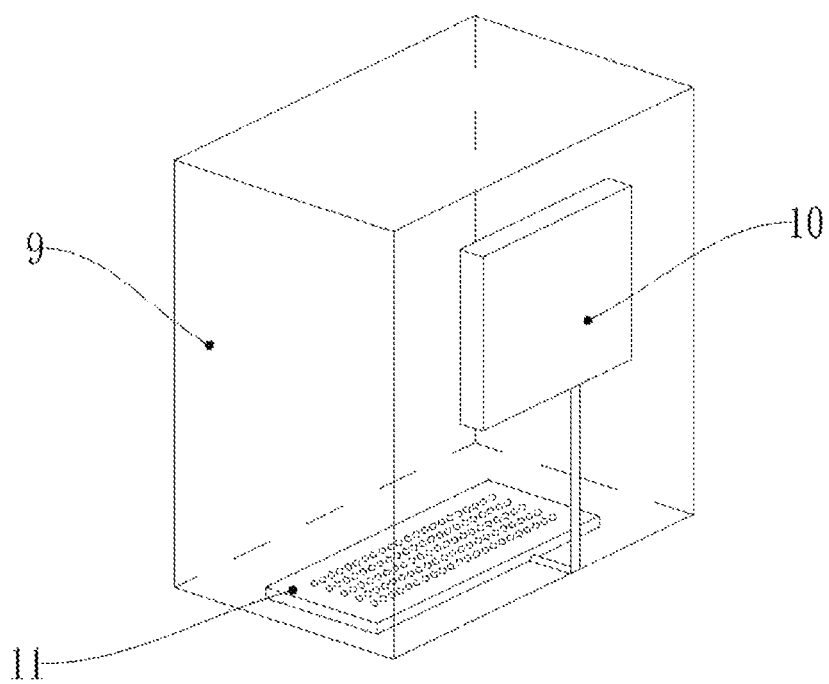
FIG. 7 schematically illustrates a structure of a cleaning device according to an embodiment of the present disclosure.

Referring to FIG. 7, the present disclosure also provides a cleaning device, including a cleaning container 9, a control panel 10, and the aforementioned film vibration device 11. The film vibration device 11 is arranged at a bottom of the cleaning container 9 and is electrically connected to the control panel 10.

The dome micro-structures on the PVDF film 8 are connected with each other through a continuous silver electrode layer 7. When an alternating current voltage is applied to the silver electrode layer 7, the electric field-induced strain causes the dome micro-structures to periodically expand and contract, so as to generate a sufficiently high resonance frequency and parallelly drive the generation of ultrasound. When the ultrasound is propagated to the precision parts in the cleaning container, a cavitation effect is produced on the surface of the precision parts, thereby removing the stains on the surface of the precision parts and completing the cleaning of the precision parts. In the specific application, the silver electrode layer 7 applies an alternating voltage through an ultrasonic function generator, where the alternating voltage is 10-35 V, and the alternating frequency is 20-100 kHz.

The film vibration device has the advantages of simple structure, low cost, low energy consumption and good scalability. The ultrasonic performance of the film vibration device is determined by the vibration of the dome micro-structures. When an alternating current voltage is applied to the silver electrode layer 7, the strain induced by the electric field leads to the periodic expansion and contraction of the dome micro-structures, thus generating ultrasonic waves with controllable frequency and controllable intensity. When the ultrasonic waves contact the precision part, a cavitation reaction occurs on the surface of the precision part, thereby removing the stains from the surface of the precision part and completing the cleaning process.

The cleaning device has a high cleaning efficiency and a good cleaning effect, and is adapted to various precision parts with complex shapes and is easy to realize remote control and automation, which can reduce the environmental pollution caused by chemical cleaning reagents and do not create noise pollution, solving the problems of high power consumption, high cost and high noise in the existing ultrasonic cleaning devices.

Example 1

Provided herein was a method of preparing a film vibration device, which included the following steps.

Photoetching was performed on a surface of a silicon wafer 3 to form a circular-hole array on the surface of the silicon wafer 3. An aluminum film was deposited on the silicon wafer 3 via a vapor deposition process to form an aluminum layer 2 on the surface of the silicon wafer 3, i.e., an aluminum mask of the silicon wafer 3. An AZ4620 photoresist was spin-coated onto the surface of the aluminum film followed by soft baking on a heating plate at 110° C. for 3 min. The photoresist layer 1 was subjected to patterning through photoetching, exposed, and developed with an AZ435 developer for 5 min to form a circular-hole array on the photoresist layer 1, where the size of the circular hole was 350 μm.

The aluminum layer 2 on the silicon wafer 3 was etched through the following steps. The photoetched silicon wafer 3 was baked in an oven at 120° C. for 30 min, and then was immersed in a type A aluminum-etching agent for etching.

The silicon wafer 3 was etched to make a porous silicon wafer 31. Specifically, the porous silicon wafer 31 was etched with plasma SF6 and C4F8. Then, the photoresist layer 1 was removed with acetone. After that, the remaining aluminum layer 2 was etched with the type A aluminum-etching agent to obtain the porous silicon wafer 31.

A porous PET film 61 was prepared through the following steps. A PET sheet 6 was adhered to one side of the porous silicon wafer 31, and was ablated with the porous silicon wafer 31 having the through-hole array as a mask. The ablated PET sheet 6 was removed from the porous silicon wafer 31 to obtain a porous PET film 61, where the thickness of the PET sheet 6 was 50 μm.

A panel of a PVDF film 8 was prepared through the following steps. The PVDF film 8 was adhered to the porous silicon wafer 31. Vacuum-pumping was performed above the porous silicon wafer 31, while the PVDF film 8 was subjected to an annealing-cooling process three times below the porous silicon wafer 31. Specifically, the PVDF film 8 was heated at 80° C. for 5 min and cooled to room temperature under the condition of maintaining a vacuum environment above the PVDF film 8. The thicknesses of the PVDF film 8 and the silver electrode layer 7 were 8 μm and 80 nm, respectively.

The film vibration device was assembled as follows. Two porous PET films 61 were laminated on two sides of the PVDF film 8 having dome micro-structures to obtain the film vibration device.

Example 2

The preparation method provided in Example 2 was basically the same as that in Example 1 except that in this example, in step (S5), the thicknesses of the PVDF film 8 and the silver electrode layer 7 were 12 μm and 85 nm, respectively.

Example 3

The preparation method provided in Example 3 was basically the same as that in Example 1 except that in this example, in step (S1), the size of the circular hole was 200 μm.

Example 4

The preparation method provided in Example 4 was basically the same as that in Example 1 except that in this example, in step (S5), the heating was performed at 85° C. for 4 min.

Example 5

The preparation method provided in Example 5 was basically the same as that in Example 1 except that in this example, in step (S5), the heating was performed at 75° C. for 6 min.

Example 6

The preparation method provided in Example 6 was basically the same as that in Example 1 except that in this example, in step (S6), the annealing-cooling operation was performed once.

Example 7

The preparation method provided in Example 7 was basically the same as that in Example 1 except that in this example, in step (S5), the PVDF film 8 included two sub-films mutually independent from each other, where two side of one sub-film were deposited with a silver electrode layer 7 having a thickness of 60 nm, and two side of the other sub-film were deposited with a silver electrode layer 7 having a thickness of 80 nm.

The film vibration devices prepared in Examples 1-6 were separately arranged at the bottom of a cleaning container and was electrically connected with a control panel. An alternating voltage was applied to the film vibration device via an ultrasonic function generator, where the alternating voltage was 15 V and the alternating frequency was 40 kHz. An aqueous solution was injected into each cleaning container, and was detected with a MUE18T ultrasonic frequency meter. The ultrasonic frequency emitted by the film vibration devices prepared in Examples 1-6 was recorded. Subsequently, the cleaning containers were each added with a to-be-cleaned precision part, and the shape and cleanliness of these to-be-cleaned precision parts were consistent. The required cleaning time was recorded, and the test results were shown in Table 1.

Comparative Example 1

The preparation method provided in Comparative Example 1 was basically the same as that in Example 1 except that in this example, an alternating voltage was applied to the film vibration device via an ultrasonic function generator, where the alternating voltage was 25 V. The output intensity of the ultrasonic sound pressure in the aqueous solution of Example 1 and Comparative Example 1 was tested using a MUE18T ultrasonic sound pressure meter.

Comparative Example 2

To-be-cleaned precision parts were cleaned using an ultrasonic cleaning machine with an ultrasonic frequency of 40 kHz.

TABLE 1

Test results of cleaning devices in Examples 1-7 and Comparative Examples 1-2

| Tests | Frequency (kHz) | Cleaning time (min) | Signal voltage amplitude (mVrms) |
|---|---|---|---|
| Example 1 | 22 | 70 | 150 |
| Example 2 | 27 | 50 | / |
| Example 3 | 38 | 29 | / |
| Example 4 | 25 | 64 | / |
| Example 5 | 23 | 62 | / |
| Example 6 | 15 | 80 | / |
| Example 7 | 22 kHz at the sub-film deposited with a silver electrode layer having a thickness of 80 nm; and 26 kHz at the sub-film deposited with a silver electrode layer having a thickness of 60 nm | 60 | / |
| Comparative Example 1 | / | / | 210 |
| Comparative Example 2 | 40 | 25 | / |

By comparing Examples 1 and 2, it was found that the frequency emitted by the film vibration device increased with the increase in the thickness of the PVDF film 8. Therefore, the frequency emitted by the film vibration device could be regulated by changing the thickness of the PVDF film 8.

By comparing Examples 2 and 3, it was found that the frequency emitted by the film vibration device increased as the diameter of the circular hole decreased. Thus, the frequency emitted by the film vibration device could be regulated by changing the size of the circular hole.

Therefore, the frequency emitted by the film vibration device was increased as the diameter of the circular hole decreased and the thickness of the film increased. Therefore, it was possible to regulate the frequency emitted by the film vibration device to reach more than 20 kHz by regulating the diameter of the circular hole and the thickness of the PVDF film 8.

By comparing Example 1 and Comparative Example 1, it was found that the intensity of the ultrasound emitted by the film vibration device increased as the alternating voltage increased. Therefore, the intensity of the ultrasound emitted by the film vibration device could be regulated by changing the magnitude of the energizing alternating voltage.

By comparing Examples 2 and 3 and Comparative Example 2, it was found that the film vibration device provided herein could be used for cleaning precision parts of industrial instruments. A larger ultrasonic frequency will lead to higher cleaning efficiency and less time consumption. However, in Comparative Example 2, a larger noise was produced, and it was risky to damage the precision parts.

It was demonstrated by the comparison among Examples 1, and 4-6 that regarding the reduced number of annealing-cooling operations, the hardness of the PVDF film would become larger, which was unfavorable to the contraction and expansion of the dome micro-structures when connected to the alternating current voltage, thereby affecting the ultrasound-generating performance of the film vibration device.

It can be concluded from the comparison between Examples 1 and 7 that depositing different thicknesses of silver electrode layers 7 on both sides of different regions of a piece of PVDF film 8 would produce different ultrasonic frequencies at different regions, thereby further leading to differences in the cleaning efficiency and time.

The technical principles of the present disclosure have been described above in combination with specific embodiments. Described above are merely intended to explain the principles of the present disclosure, and should not be construed as limitations to the scope of the present disclosure in any way. Though the present disclosure has been described in detail above, those skilled in the art can still make various changes, modifications and replacements to the technical solutions mentioned in the embodiments disclosed herein. It should be noted that those changes, modifications and replacements made based on the content disclosed herein without departing from the spirit of the disclosure shall fall within the scope of the disclosure defined by the appended claims.

What is claimed is:
1. A method of fabricating a film vibration device, comprising:
(S1) forming a circular-hole array on a surface of a silicon wafer by photoetching;
(S2) etching an aluminum layer on the silicon wafer;
(S3) etching the silicon wafer to form a through-hole array, so as to obtain a porous silicon wafer;
(S4) attaching a polyethylene terephthalate (PET) sheet to a side of the porous silicon wafer; and subjecting the PET sheet to breakdown with the porous silicon wafer as a mask to obtain a porous PET film;
(S5) attaching a polyvinylidene fluoride (PVDF) film to a lower side of the porous silicon wafer; performing vacuumization above the porous silicon wafer, and simultaneously heating the PVDF film below the porous silicon wafer such that a plurality of dome micro-structures are formed on the PVDF film; and
(S6) laminating the porous PET film on each of two sides of the PVDF film having the plurality of dome micro-structures to obtain the film vibration device;
wherein in step (S5), the heating is performed through three annealing-cooling operations, each comprising:

heating a bottom of the PVDF film at 75-85° C. for 4-6 min; and cooling the PVDF film to room temperature while keeping vacuum above the PVDF film.

2. The method of claim 1, wherein step (S1) comprises:
(S1-1) depositing an aluminum film on the silicon wafer to form the aluminum layer on the surface of the silicon wafer;
(S1-2) applying a photoresist to a top of the aluminum film followed by soft baking to form a photoresist layer on the surface of the aluminum layer; and
(S1-3) subjecting the photoresist layer to patterning through photoetching followed by exposure and development with a developer.

3. The method of claim 1, wherein step (S2) comprises:
(S2-1) drying the silicon wafer after photoetched; and
(S2-2) immersing the silicon wafer in an aluminum etchant to etch an exposed part of the aluminum layer.

4. The method of claim 1, wherein step (S3) comprises:
(S3-1) etching the silicon wafer through a plasma reaction;
(S3-2) removing a photoresist layer; and
(S3-3) etching a remaining part of the aluminum layer with an aluminum etchant to obtain the porous silicon wafer.

5. The method of claim 1, wherein step (S4) comprises:
(S4-1) attaching the PET sheet to the side of the porous silicon wafer, wherein the PET sheet has a thickness of 45-55 μm; and
(S4-2) ablating the PET sheet by a laser grating with the porous silicon wafer as the mask; and separating an ablated PET sheet from the porous silicon wafer to obtain the porous PET film.

6. The method of claim 1, wherein a thickness of the PVDF film is 8-12 μm.

7. The method of claim 1, wherein each of two sides of the PVDF film is coated with a silver electrode layer having a thickness of 60-80 nm.

8. A film vibration device prepared by the method of claim 1, comprising:
a first porous PET film;
a second porous PET film; and
a PVDF film;
wherein the PVDF film is sandwiched between the first porous PET film and the second porous PET film; the first porous PET film and the second porous PET film have the same structure; the first porous PET film is arranged above the PVDF film; and the second porous PET film is arranged below the PVDF film; and
the PVDF film is provided with a plurality of dome micro-structures adapted to a through-hole array of the first porous PET film; the plurality of dome microstructures are embedded in the through-hole array of the first porous PET film; and two sides of the PVDF film are each coated with a silver electrode layer.

9. A cleaning device, comprising:
a container;
a control panel; and
the film vibration device of claim 8;
wherein the film vibration device is arranged on a bottom of the container, and is electrically connected with the control panel.

* * * * *